(12) United States Patent
Kyoung et al.

(10) Patent No.: US 10,720,535 B2
(45) Date of Patent: *Jul. 21, 2020

(54) SIC WIDE TRENCH-TYPE JUNCTION BARRIER SCHOTTKY DIODE AND MANUFACTURING METHOD THEREFOR

(71) Applicant: PowerCubeSemi, INC., Bucheon-si, Gyeonggi-do (KR)

(72) Inventors: Sin Su Kyoung, Seoul (KR); Tae Young Kang, Gawngju-si (KR)

(73) Assignee: PowerCubeSemi, INC., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/797,601

(22) Filed: Feb. 21, 2020

(65) Prior Publication Data
US 2020/0194600 A1  Jun. 18, 2020

Related U.S. Application Data

(63) Continuation of application No. 16/138,618, filed on Sep. 21, 2018, now Pat. No. 10,629,754, which is a
(Continued)

(30) Foreign Application Priority Data

Aug. 10, 2016  (KR) .................. 10-2016-0101891

(51) Int. Cl.
    *H01L 29/872* (2006.01)
    *H01L 29/66* (2006.01)
    (Continued)

(52) U.S. Cl.
    CPC ...... *H01L 29/8725* (2013.01); *H01L 21/3086* (2013.01); *H01L 21/324* (2013.01);
    (Continued)

(58) Field of Classification Search
None
See application file for complete search history.

(56) References Cited

U.S. PATENT DOCUMENTS

| | | |
|---|---|---|
| 7,282,386 B2 | 10/2007 | Khemka et al. |
| 9,006,858 B2 | 4/2015 | Qu et al. |

(Continued)

FOREIGN PATENT DOCUMENTS

| | | |
|---|---|---|
| JP | 2014-053392 A | 3/2014 |
| KR | 10-2005-0048949 A | 5/2005 |

(Continued)

OTHER PUBLICATIONS

Kyoung et al., "Improving Current Density of 4H—SiC Junction Barrier Schottky diode with Wide Trench Etching," Department of Electrical Engineering, Korea University, Republic of Korea; Powercubesemi, Inc. Research and Development, Republic of Korea; 6 pages.

(Continued)

*Primary Examiner* — Alexander G Ghyka
(74) *Attorney, Agent, or Firm* — Knobbe Martens Olson & Bear LLP

(57) ABSTRACT

Disclosed is a SiC wide trench-type junction barrier Schottky diode. The Schottky diode includes a SiC N–epitaxial layer formed on a SiC N+-type substrate and a Schottky metal layer having a planar Schottky metal pattern layer and a downwardly depressed trench-type Schottky metal pattern layer, which are alternately formed at predetermined intervals and on the upper end part of the SiC N–epitaxial layer. The Schottky diode includes a P+ junction pattern formed so as to permeate from the lower part of the (Continued)

trench-type Schottky metal pattern layer to the SiC N−epitaxial layer and a cathode electrode formed on the lower part of the SiC N$^+$-type substrate. The width of the P$^+$ junction pattern is narrower than the width of the trench-type Schottky metal pattern layer, and the P$^+$ junction pattern is not formed on a side wall vertical surface region of the trench-type Schottky metal pattern layer.

8 Claims, 16 Drawing Sheets

Related U.S. Application Data continuation of application No. PCT/KR2016/012165, filed on Oct. 27, 2016.

(51) Int. Cl.
| | |
|---|---|
| *H01L 29/06* | (2006.01) |
| *H01L 29/16* | (2006.01) |
| *H01L 21/324* | (2006.01) |
| *H01L 21/308* | (2006.01) |

(52) U.S. Cl.
CPC ...... *H01L 29/0619* (2013.01); *H01L 29/6606* (2013.01); *H01L 29/66143* (2013.01); *H01L 29/872* (2013.01); *H01L 29/1608* (2013.01)

(56) References Cited

U.S. PATENT DOCUMENTS

| | | |
|---|---|---|
| 2002/0008237 A1 | 1/2002 | Chang et al. |
| 2004/0031971 A1* | 2/2004 | Shimoida ............... H01L 29/267 257/199 |
| 2007/0090481 A1 | 4/2007 | Richieri |
| 2014/0001489 A1 | 1/2014 | Yen et al. |
| 2014/0308799 A1 | 10/2014 | Chen et al. |
| 2015/0206941 A1 | 7/2015 | Uehigashi et al. |
| 2016/0247894 A1 | 8/2016 | Hamada et al. |
| 2017/0271455 A1 | 9/2017 | Tawara |
| 2018/0277371 A1* | 9/2018 | Nakano ............... H01L 29/7806 |
| 2019/0027616 A1* | 1/2019 | Kyoung ............. H01L 29/6606 |
| 2019/0237558 A1 | 8/2019 | Hamada et al. |
| 2019/0326447 A1 | 10/2019 | Mudholkar et al. |
| 2020/0083388 A1* | 3/2020 | Aketa ................... H01L 23/535 |

FOREIGN PATENT DOCUMENTS

| | | |
|---|---|---|
| KR | 10-2010-0122280 A | 11/2010 |
| KR | 10-1233953 B1 | 2/2013 |
| KR | 10-2014-0099879 A | 8/2014 |

OTHER PUBLICATIONS

International Search Report dated May 31, 2017 in International Application No. PCT/KR2016/015165.

* cited by examiner

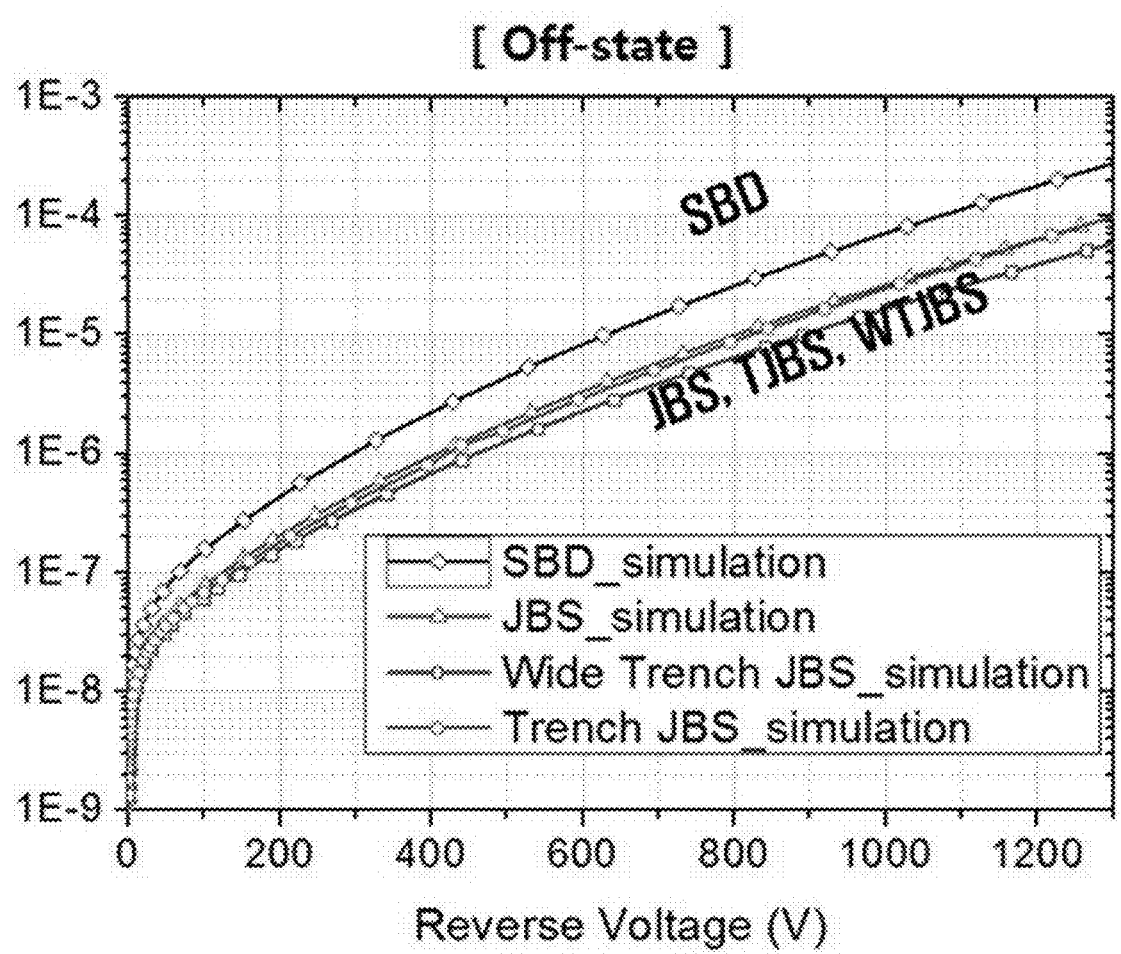

SIC WIDE TRENCH-TYPE JUNCTION BARRIER SCHOTTKY DIODE AND MANUFACTURING METHOD THEREFOR

CROSS-REFERENCE TO RELATED APPLICATIONS

This application is a continuation of U.S. application Ser. No. 16/138,618, filed Sep. 21, 2018, which claims the benefit under 35 U.S.C. §§ 120 and 365 of PCT Application No. PCT/KR2016/012165, filed on Oct. 27, 2016, which is hereby incorporated by reference. PCT/KR2016/012165 also claimed priority to Korean Patent Application No. 10-2016-0101891, filed on Aug. 10, 2016, which is hereby incorporated by reference.

BACKGROUND

Field

The present disclosure relates to a SiC wide trench-type junction barrier Schottky diode and a manufacturing method therefor.

Description of the Related Art

A Schottky diode is made by bonding a semiconductor and a metal, and the Schottky diode may be fabricated using a metal-semiconductor junction which provides a Schottky barrier and is generated between a metal layer and a doped semiconductor layer.

The Schottky diode has a small forward voltage in an ON state which allows a current to flow in a forward bias direction, and the Schottky barrier generally has capacitance that is smaller than that of a general p-n diode.

The Schottky diode has a threshold voltage that is lower than that of a general diode.

Since the Schottky diode has a low threshold voltage, i.e., a low voltage drop, efficiency in terms of power energy is improved, and thus signal distortion may be low.

The Schottky diode has a characteristic in which a reverse recovery time is shortened because a current flows through majority carriers and thus there is no accumulation effect like a general diode.

Such a Schottky diode has an advantage of having a higher switching speed than a p-n diode, but has a disadvantage in that a larger reverse bias leakage current occurs than in a p-n diode due to a relatively low reverse bias voltage rating.

That is, the Schottky diode has a fast turn-on voltage and a high current density, but it has the disadvantage of a large leakage current in an OFF state caused by thermal electron emission and a Schottky barrier reduction phenomenon.

In order to improve efficiency of a semiconductor including such a Schottky diode, there is a demand for a technique of reducing resistance of an ON state in a turn-on state to increase a current density in an ON state and reducing a leakage current in a turn-off state.

A related art in conjunction with the present invention is disclosed in Korean Patent Registration No. 10-1233953 (entitled, Schottky Device and Manufacturing Method).

SUMMARY

The present disclosure is directed to providing a SiC wide trench-type junction barrier Schottky diode capable of maintaining a characteristic of reducing a leakage current by improving a junction pattern structure in a junction barrier Schottky diode and improving a current density characteristic in an ON state, and a manufacturing method therefor.

One aspect of the present invention provides a method of manufacturing a SiC wide trench-type junction barrier Schottky diode, the method including forming a SiC N⁻ epitaxial layer, which is doped with an N⁻ type impurity, on a SiC N⁺ type substrate, forming a hard mask pattern for trench etching on an upper end part of the N⁻ epitaxial layer, and then forming a downwardly depressed trench at predetermined intervals by performing etching, forming an oxide film mask for a space for P⁺ ion implantation on the upper end part of the N_ epitaxial layer by removing the hard mask pattern, wherein the oxide film mask is formed to cover a sidewall of the trench so as to form the space for P⁺ ion implantation to be narrower than a width of the trench, forming a P⁺ junction pattern on a lower part of the trench by injecting P⁺ ions from an upper portion of an oxide film mask pattern, after the forming of the P⁺ junction pattern, removing the oxide film mask and performing first annealing, after the performing of first annealing, forming a Schottky metal layer by applying a Schottky metal to the upper end part of the N⁻ epitaxial layer at which the trench is formed, and after the forming of the Schottky metal, forming upper and lower electrodes and performing second annealing for metal bonding.

The P⁺ junction pattern may be formed to be narrower than a width of the trench.

A width of the P⁺ junction pattern may be formed in a range of 2 (±5%) to 4 (±5%) μm, and a vertical depth of the P⁺ junction pattern may be formed with 0.5 (±5%) μm.

A space between the P⁺ junction patterns may be formed in a range of 2 (±5%) to 4 (±5%) μm.

The space between the P⁺ junction patterns may be formed to be 2.2 (±5%) μm.

A vertical depth $d_t$ of the trench and a vertical depth $d_j$ of a P⁺ junction pattern may be formed in a range satisfying the following Equation 1:

$$\left(\frac{S_j}{2} + d_j + d_t\right)^2 = \left(\frac{S_j}{2} + d_j\right)^2 + \left(\frac{S_j}{2}\right)^2 \quad \text{Equation 1}$$

wherein $S_j$ denotes a width between the P⁺ junction patterns, $d_j$ denotes a vertical depth of the P⁺ junction pattern, and d denotes a vertical depth of the trench.

In the forming of the trench, a vertical depth of the trench may be in a range of 0.3 (±5%) to 0.5 (±5%) μm, and a width of the trench may be in a range of 3 (±5%) to 5 (±5%) μm.

The Schottky metal layer may be formed by applying Ti with a thickness of 3000 (±5%) Å.

The first annealing may be performed at a temperature of 1,700 (±5%)° C., and the second annealing may be performed at a temperature of 450 (±5%)° C.

A doping concentration of the N⁻ epitaxial layer may be 1.0 (±5%)×10¹⁵ cm⁻³, and a vertical height of the N⁻ epitaxial layer may be formed to be 15 (±5%) μm.

Another aspect of the present invention provides a SiC wide trench-type junction barrier Schottky diode including a SiC N⁻ epitaxial layer formed on a SiC N⁺ type substrate, a Schottky metal layer in which a planar Schottky metal pattern layer and a downwardly depressed trench-type Schottky metal pattern layer are alternately formed on an upper end part of the SiC N⁻ epitaxial layer at predetermined intervals, a P⁺ junction pattern formed by permeating into the SiC N⁻ epitaxial layer below the trench-type Schottky metal pattern layer, and a cathode electrode formed on a lower part of the SiC N+ type substrate, wherein a width of the P+ junction pattern is formed to be narrower than that of the trench-type Schottky metal pattern layer, and the P+ junction pattern is not formed in a vertical surface area of a sidewall of the trench-type Schottky metal pattern layer.

A SiC wide trench-type junction barrier Schottky diode according to one embodiment of the present invention has an effect of optimally increasing a current density characteristic of an ON state while maintaining a characteristic of a leakage current reduced by a junction pattern.

BRIEF DESCRIPTION OF THE DRAWINGS

FIG. 20 is a graph showing electrical characteristics in OFF states of the SBD, the JBS, the TJBS, and the WTJBS.

DETAILED DESCRIPTION

Figure 1:
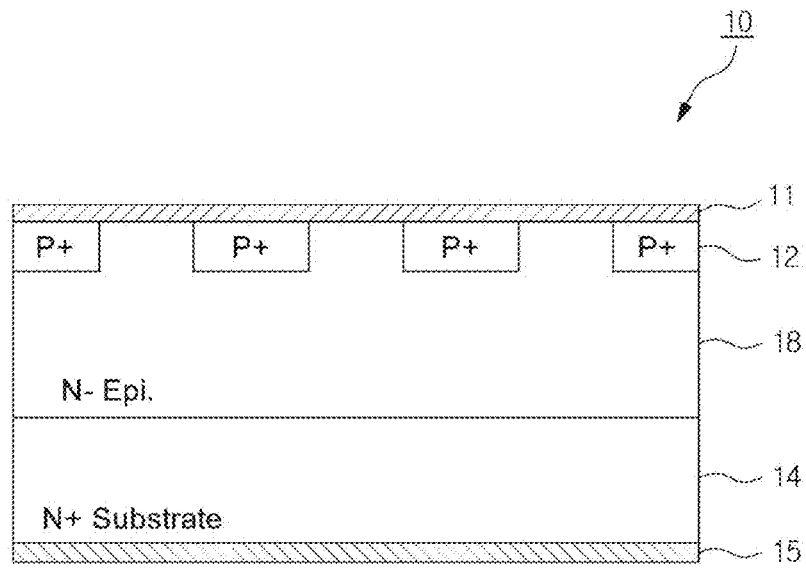
FIG. 1 is a diagram illustrating a structure of a general junction barrier Schottky diode (JBS).

The present invention may be modified into various forms and may have a variety of embodiments, and, therefore, specific embodiments will be illustrated in the drawings and described in detail.

The embodiments, however, are not to be taken in a sense which limits the present invention to the specific embodiments, and should be construed to include modifications, equivalents, or substitutes within the spirit and technical scope of the present invention.

Also, in the following description of the present invention, when a detailed description of a known related art is determined to unnecessarily obscure the gist of the present invention, the detailed description thereof will be omitted.

In the drawings, some portions not related to the description will be omitted in order to clearly describe the present invention, and similar reference numerals are given to similar components throughout the disclosure.

The present disclosure relates to a SiC wide trench-type junction barrier Schottky diode (SiC WTJBS) and a manufacturing method therefor.

Hereinafter, a SiC WTJBS according to one embodiment of the present invention and a manufacture method therefor will be described in comparison with a related art.

FIG. 1 is a diagram illustrating a general junction barrier Schottky diode structure.

FIG. 1 illustrates a structure of a junction barrier Schottky diode (hereinafter, referred to as a "JBS") 10 in which a junction is implemented to reduce a leakage current in an existing Schottky diode element.

Referring to FIG. 1, an N− epitaxial layer 18 is formed on an N+ substrate 14.

A cathode electrode 15 is formed on a lower part of the N+ substrate 14.

A P+ junction pattern 12 is formed at an inner surface of an upper end of the N− epitaxial layer 18 at predetermined intervals.

A Schottky metal terminal layer 11 is formed at an upper part of the 1P junction pattern 12 and an upper part of the remaining N− epitaxial layer.

A portion at which the P+ junction pattern is formed becomes a PN junction in the form of a vertical space to perform a function which is the same as that of a PiN diode.

Therefore, in the JBS of FIG. 1, an equivalent circuit may be formed such that a general Schottky barrier diode (SBD) and a PiN diode are connected in parallel.

In an OFF state of the JBS, the PiN diode and the SBD simultaneously applied by an OFF state voltage. At this point, since the PiN diode has a thickness of an epitaxial layer shorter than the SBD by a P+ junction depth, the PiN diode is applied by more OFF state electric fields, and a smaller electric field is applied to a Schottky junction. Consequently, the electric field applied to a surface of the Schottky junction may be reduced such that a leakage current may be reduced.

Therefore, the JBS of FIG. 1 has an effect of reducing the leakage current caused by the formation of the P+ junction pattern 12.

Meanwhile, during an ON state operation, the PiN diode and the SBD are connected in parallel, a current flows according to an applied forward voltage, and since a turn-on voltage in a space region of the P+ junction pattern serving as the PiN diode is higher than a required operating voltage, the current only flows to the space region serving as the SBD to perform the ON state operation.

Therefore, a current density characteristic in an ON state is reduced in the JBS of FIG. 1 as compared with a general SBD operated by a current flowing in an entire region.

Therefore, the formation of the P+ junction pattern 12 in the JBS of FIG. 1 acts as a factor for reducing a current density in an ON state.

Meanwhile, when the intervals between the P+ junction patterns 12 in the JBS of FIG. 1 are increased, a Schottky area is increased and thus the current density may be improved. However, an area in which a leakage current is generated increases by an increment of the Schottky area so that it is difficult to resolve a trade-off with respect to the current density and the leakage current.

Further, when a depth of the P⁺ junction pattern 12 becomes deeper, the leakage current may theoretically be further reduced. However, a problem may occur in a manufacturing process due to deepening a doping depth in SiC.

Further, lateral diffusion occurs in the JBS due to the P⁺ junction pattern and lateral diffusion in SiC diffuses to a length equal to a depth of the junction pattern so that when the depth of the junction pattern becomes deeper, lateral diffusion of the junction pattern increases. In this case, a total current density decreases.

In the JBS, an electric field shielding effect of the P⁺ junction pattern may be increased as the depth of the junction pattern increases, but an ON state characteristic is that, as the depth of the junction pattern increases, a length of a junction field effect transistor (JFET) resistor $R_{JFET}$ becomes longer and thus overall resistance increases such that a problem may occur in that the ON state characteristic degrades.

The JBS has an effect of reducing the leakage current due to the formation of the P⁺ junction pattern 12, but on the other hand, the formation of the P⁺ junction pattern 12 acts as a factor for decreasing the current density characteristic in the ON state.

Figure 2:
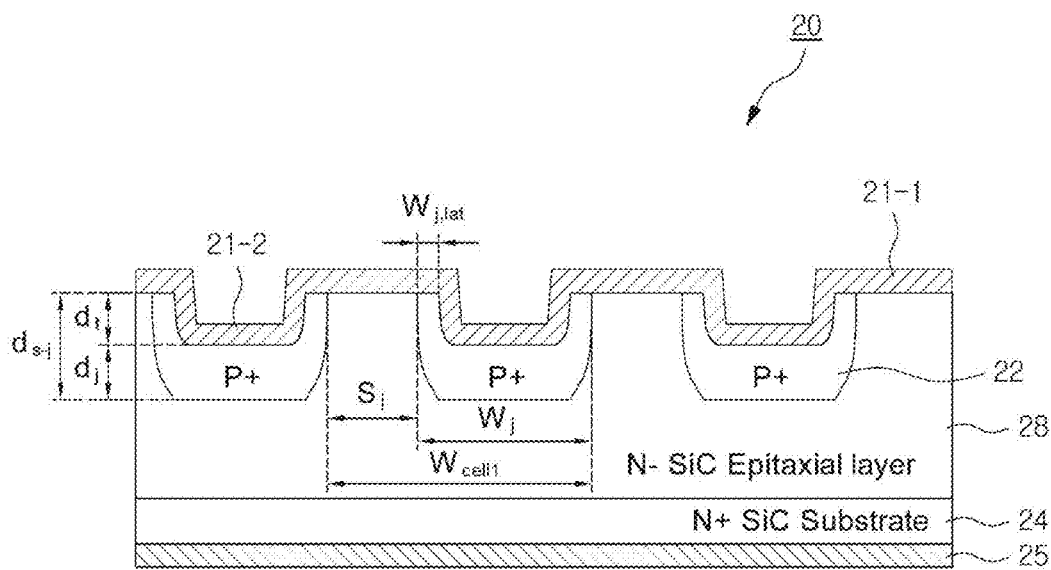
FIG. 2 is a diagram illustrating a structure of a trench-type junction barrier Schottky diode (TJBS) in which a leakage current is reduced in the general JBS structure.

FIG. 2 is a diagram illustrating a trench-type junction barrier Schottky diode (TJBS) structure in which a leakage current is reduced in the general JBS structure.

In a SiC process, a depth of the junction pattern which may be generally doped is only in the range of 0.4 to 0.8 μm, so a SiC JBS has a limitation on implementation of a deep junction pattern.

Further, the depth of the junction pattern should be increased so as to overcome the trade-off with respect to the leakage current-current density of the JBS, but considering the lateral diffusion of the junction pattern, it is difficult to implement a deep depth of the junction pattern in a general planar type JBS.

FIG. 2 illustrates a structure of a SiC TJBS 20 in which leakage current reduction efficiency is increased more than that of a planar JBS using trench etching so as to resolve the above-described problem.

Referring to FIG. 2, the structure of the TJBS 20 is configured such that an N⁻ epitaxial layer 28 is formed on an upper part of an N⁺ substrate 24 and a cathode electrode 25 is formed on a lower part of the N⁺ substrate 24.

A planar Schottky metal 21-1 and a downwardly depressed trench-type Schottky metal 21-2 are alternately formed at predetermined intervals on an upper end part of the N⁻ epitaxial layer 28.

A P⁺ junction pattern 22 is formed on a lower part and a lateral surface of the trench-type Schottky metal 21-2.

The TJBS of FIG. 2 is characterized in that the P⁺ junction pattern 22 is more deeply distributed by trench etching process than in the JBS 10 of FIG. 1.

Owing to the P⁺ junction pattern 22 being more deeply distributed, an effect of reducing an electric field in the Schottky junction is further increased so that a leakage current may be reduced more than that of the JBS of FIG. 1.

An ON state operation in the TJBS is the same as that in the JBS 10 in FIG. 1.

Similar to the JBS 10 of FIG. 1, an operating voltage at a path of the P⁺ junction pattern 22 is higher than an operating voltage range of the diode such that the TJBS 20 is operated by blocking a current from flowing in the path of the P⁺ junction pattern 22 in an ON state and allowing the current to only flow in a path of the Schottky junction.

Figure 3:
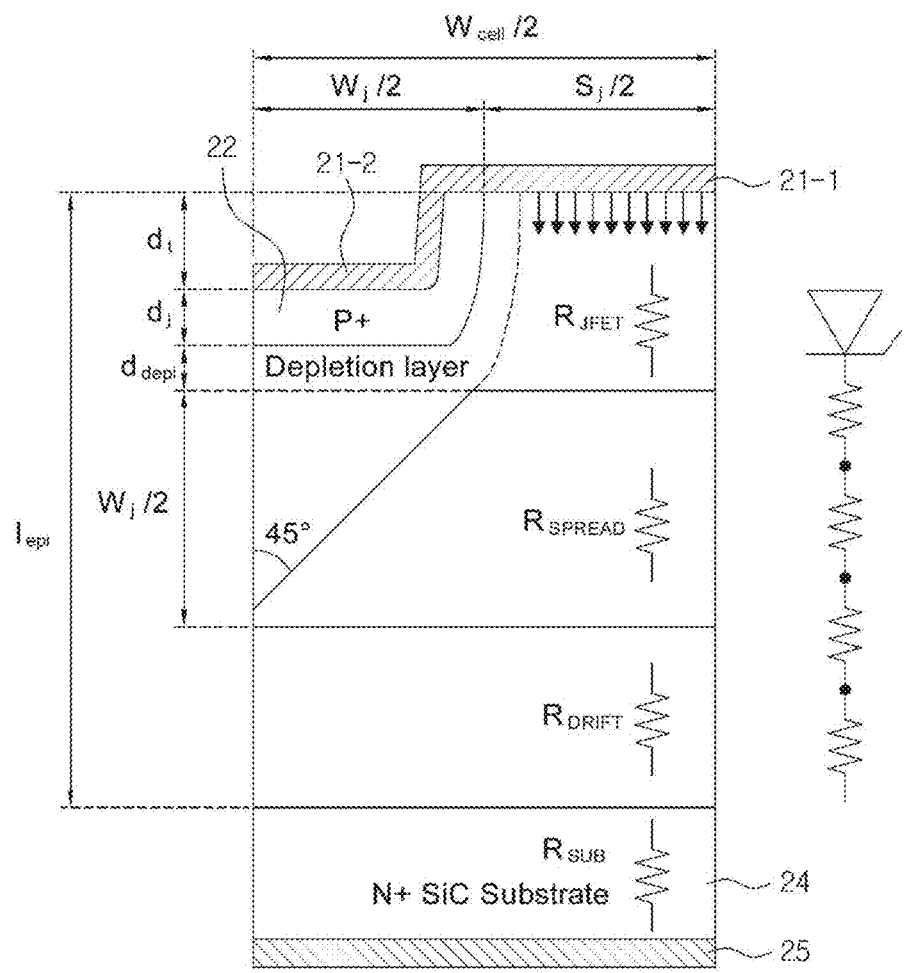
FIG. 3 is a diagram for describing a current flow and a resistance distribution in an ON state of the TJBS of FIG. 2.

FIG. 3 is a diagram for describing a current flow and a resistance distribution in an ON state of the TJBS of FIG. 2.

Referring to FIG. 3, a voltage drop of the TJBS in the ON state may be expressed by Equation 1.

$$V_F = (\Phi_{BN} - \Delta\Phi_{BN}) + \frac{kT}{q}\ln\left(\frac{(S_j/W_{cell})J_F}{A^{**}T^2}\right) + J_F R_{total,sp} \quad \text{Equation 1}$$

Here, $V_F$ means a forward voltage drop, $\Phi_{BN}$ means a height of a Schottky junction barrier, $\Delta\Phi_{BN}$ means a height of a Schottky junction barrier reduced by an image charge barrier descent phenomenon, $A^{**}$ means an effective Richardson constant, k means a Boltzmann constant, $S_j$ means a width between P⁺ junction patterns, $W_{cell}$ means an overall width of a single cell, $J_F$ means a forward current density, and $R_{total,sp}$ means the sum of resistance components in consideration of an area.

In Equation 1, $R_{total,sp}$ may be expressed as Equation 2 by referring to a resistance distribution in FIG. 2.14.

$$R_{total,sp(JBS)} = R_{SUB} + R_{Drift,sp} + R_{spread,sp} + R_{JFET,sp} \quad \text{Equation 2}$$

Here, $R_{SUB}$ means substrate resistance, $R_{Drift,sp}$ means resistance of an N⁻ epitaxial layer region in an ON state in consideration of an area, $R_{Spread,sp}$ means resistance of a current region diffused across a JFET region, and $R_{JFET,sp}$ means a specific resistance of the JFET region in consideration of the area.

The resistance components of Equation 1 may be represented as Equations 3 to 5 using lengths shown in FIG. 3.

$$R_{Drift,sp} = \rho_D\left(l_{epi} - d_j - d_t - \frac{W_j}{2} - w_{depl}\right) \quad \text{Equation 3}$$

Here, PD means resistivity of an N⁻ epitaxial layer, lepi means a length of the N⁻ epitaxial layer, $d_j$ means a depth of the P⁺ junction pattern, $d_t$ means a vertical depth of a trench, $W_j$ means a width of the P⁺ junction pattern, and $W_{depl}$ means a width of a depletion region in an ON state.

$$R_{spread,sp} = \rho_D W_{cell} \ln\left(\frac{W_{cell}}{\frac{S_j}{2} - w_{depl}}\right) \quad \text{Equation 4}$$

$$R_{JFET,sp} = \frac{\rho_D W_{cell}(d_j + d_t + w_{depl})}{\frac{S_j}{2} - w_{depl}} \quad \text{Equation 5}$$

A current density ($J_{TJBS}$) characteristic reduced by the resistance components and the junction pattern structure may be expressed by the following Equation 6.

$$J_{JBS} = \frac{S_j}{W_{Cell}} J_S\left[\exp\left(\frac{q(V_a - J_p R_{total,sp})}{nkT}\right) - 1\right] \quad \text{Equation 6}$$

Here, $J_S$ means a saturation current, $V_a$ means an applied voltage, and n means an ideal factor.

Referring to Equation 6, it can be seen that the current density in the TJBS is determined by an area ratio of the Schottky junction to all the cells.

Therefore, as in the JBS in FIG. 1, a surface current is decreased due to the deeper junction depth, and thus the leakage current in the TJBS is reduced as compared with the JBS in FIG. 1, but an influence by which the current density is reduced due to the length of the $R_{JFET}$ still remains.

Further, a leakage current $J_{L,TJBS}$ in an OFF state is expressed by the following Equation 7.

$$J_{L,JBS} = -\frac{S_j}{W_{cell}} A^{**} T^2 \exp\left(-\frac{q(\Phi_{BN} - \Delta\Phi_{BN})}{kT}\right) \quad \text{Equation 7}$$

Like the JBS, the TJBS is also a structure for sacrificing the current density to reduce the leakage current such that it is analyzed that the TJBS has a limitation in being applied to a higher breakdown voltage and a large current for a power system having a higher breakdown voltage or a power system requiring a large amount of current.

Figure 4:
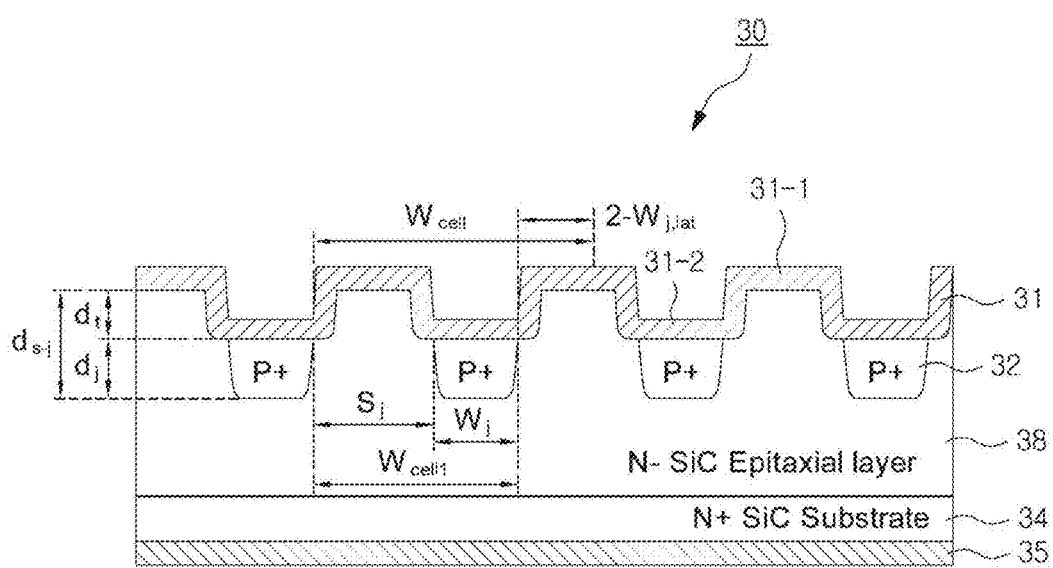
FIG. 4 is a diagram illustrating a structure of a SiC wide TJBS (WTJBS) in which a current density is improved according to one embodiment of the present invention.

FIG. 4 is a diagram illustrating a structure of the SiC wide TJBS (WTJBS) in which a current density is improved according to one embodiment of the present invention.

FIG. 4 illustrates the structure of the WTJBS which is capable of improving a current density characteristic without increasing a leakage current according to one embodiment of the present invention.

In the examples of the JBS of FIG. 1 and the TJBS of FIG. 2, the electric field applied to the Schottky junction is reduced as the depth of the P$^+$ junction pattern becomes deeper such that the leakage current may be reduced.

However, while the leakage current is reduced, the Schottky junction area is reduced by the P$^+$ junction pattern region, and thus a tolerable current density characteristic is also reduced.

As shown in FIG. 4, in order to resolve the above-described problems, the SiC WTJBS according to one embodiment of the present invention is characterized as using a wide trench-type Schottky metal that is wider than where a P$^+$ junction pattern region is formed.

The wide trench-type Schottky metal that is wider than the P$^+$ junction pattern region is formed in the SiC WTJBS according to an embodiment of the present invention so that a bottom portion of the P$^+$ junction pattern region, which withstands an electric field in the OFF state, is formed and a side wall of a trench remains as a Schottky junction such that an effect, in which the overall Schottky junction area is increased as compared with the related art, can be achieved.

Referring to FIG. 4, a WTJBS 30 according to one embodiment of the present invention is configured such that a SiC N$^-$ epitaxial layer 38 is formed on an upper part of a SiC N$^+$ substrate 34, and a cathode electrode 35 is formed on a lower part of the SiC N$^+$ substrate 34.

A Schottky metal layer 31, where a planar Schottky metal pattern layer 31-1 and a downwardly depressed trench-type Schottky metal pattern layer 31-2 are alternately formed at predetermined intervals, is formed on an upper end part of the SiC N$^-$ epitaxial layer 38.

A P$^+$ junction pattern 32 having a width narrower than that of the trench-type Schottky metal pattern layer 31-2 is formed below the trench-type Schottky metal pattern layer 31-2 by permeating into the SiC N$^-$ epitaxial layer 38.

The width of the downwardly depressed trench-type Schottky metal pattern layer 31-2 according to one embodiment of the present invention is greater than the width of the P$^+$ junction pattern 32.

Therefore, in the SiC WTJBS according to one embodiment of the present invention, the P$^+$ junction pattern 32 is not formed at a vertical surface of a side wall of the trench-type Schottky metal 31-2.

That is, the SiC WTJBS 30 according to one embodiment of the present invention is characterized in that a P$^+$ junction pattern having a width narrower than that of the trench-type Schottky metal 31-2 is formed.

Accordingly, in the SiC WTJBS 30 according to one embodiment of the present invention, the Schottky junction region is formed at the sidewall of the trench-type Schottky metal 31-2.

In the TJBS 20 of FIGS. 2 and 3, a P$^+$ junction pattern is formed in a vertical surface region of the sidewall by sidewall ion implantation, thereby preventing the Schottky junction region of the sidewall of the trench from being exposed.

When a thickness of a sidewall P$^+$ junction is $W_{j,lat}$, a unit cell of the TJBS of FIG. 3 includes the thickness of the sidewall P$^+$ junction.

Referring to FIG. 4, since the sidewall of the trench of the trench-type Schottky metal 31-2 is exposed to the N$^-$ epitaxial layer, the SiC WTJBS 30 according to one embodiment of the present invention has a form in which $W_{j,lat}$ of the TJBS 20 is removed such that the unit cell is reduced by $2W_{j,lat}$ as compared with the TJBS of FIG. 3 and thus the current density may be improved.

Further, since a Schottky area is constituted by the sidewall, the area of the Schottky junction is further increased by $d_t$, which is a depth of the trench, in addition to a distance $S_j$ between the P$^+$ junctions.

A current density $J_{WTJBS}$ of the SiC WTJBS according to one embodiment of the present invention is expressed by Equation 8.

$$J_{WTJBS} = \frac{S_j + 2d_t}{W_{Cell2}} J_s \left[ \exp\left(\frac{q(V_a - J_p R_{total,sp})}{nkT}\right) - 1 \right] \quad \text{Equation 8}$$

Here, $S_j$ means a width between P$^+$ junction patterns, $d_t$ means a vertical depth of a trench, $W_{cell}$ means an overall width of a single cell in $W_{TJBS}$, $J_S$ means a saturation current, $V_a$ means an applied voltage, $J_F$ means a forward current density, n means an ideal factor, and $R_{total,sp}$ means the sum of resistance components in consideration of an area.

Referring to Equation 8, the Schottky junction area, which is a numerator in a rate for determining the current density, is increased by $2d_t$ corresponding to the depth of the trench, and a unit cell size, which is a denominator, becomes $W_{Cell2} = (W_{Cell1} - 2W_{j,lat})$, thereby being reduced by $2W_{j,lat}$ as compared with the TJBS of FIG. 3.

Figure 5:
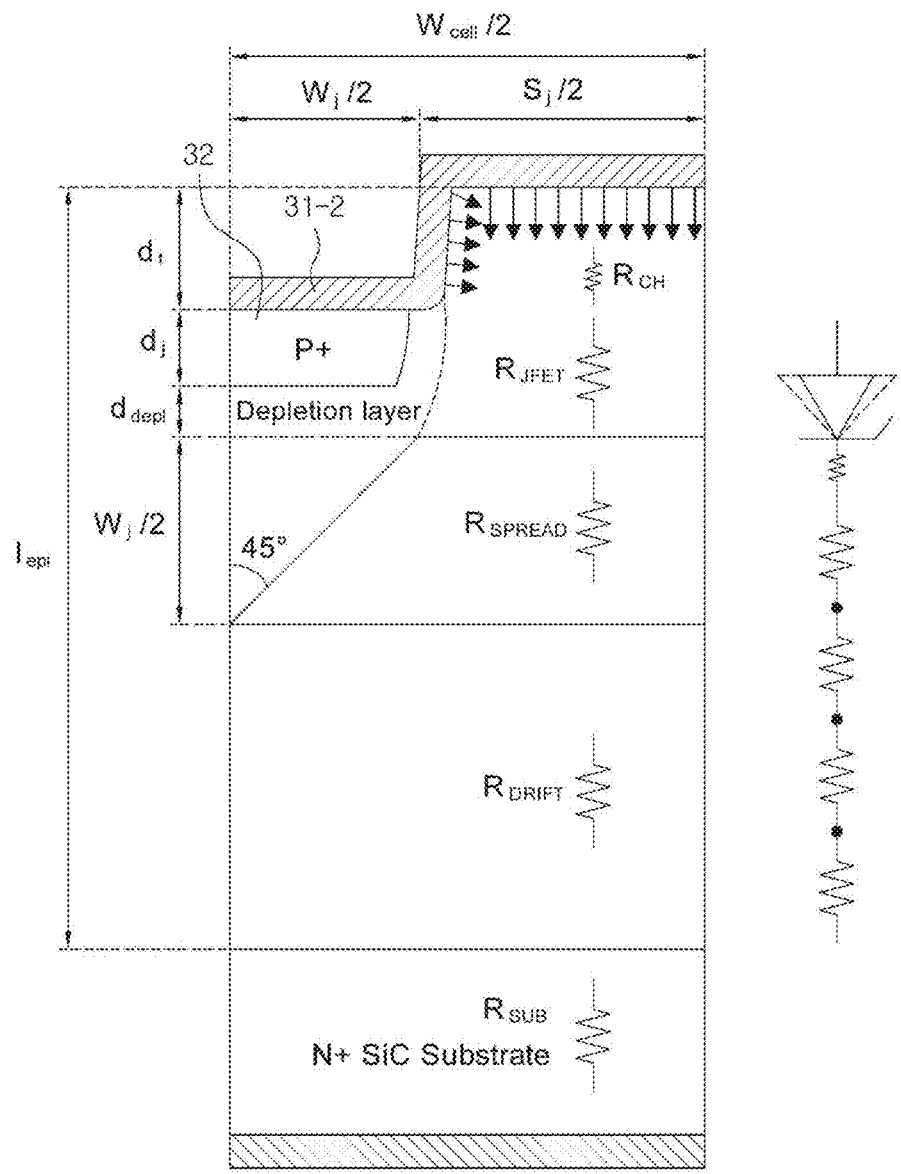
FIG. 5 is a diagram illustrating a current flow and a resistance distribution in an ON state in the structure of the SiC WTJBS according to one embodiment of the present invention.

FIG. 5 is a diagram illustrating a current flow and a resistance distribution in an ON state in the structure of the SiC WTJBS according to one embodiment of the present invention.

Referring to the structure of the SiC WTJBS of FIG. 5 according to one embodiment of the present invention, the Schottky junction which allows a current to flow in the ON state is increased by the depth of the trench and thus a current path is increased, and also since there is no sidewall P$^+$ junction as in the conventional TJBS of FIG. 2, a path of $R_{JFET}$ becomes shorter than the related art. Accordingly, in the TJBS of FIG. 3, resistance of $R_{CH}$ that is smaller than that of the $R_{JFET}$ by the shortened path is provided at a region where the $R_{JFET}$ is distributed.

A specific resistance $R_{JFET,SP}$ of a JFET region in consideration of an area of the WTJBS according to one embodiment of the present invention and a channel resistance $R_{CH,SP}$ in an ON state in consideration of an area are expressed by Equations 9 and 10.

$$R_{JFET,sp} = \frac{\rho_D W_{cell}(d_j + w_{depl})}{\frac{S_j}{2} - w_{depl}} \quad \text{Equation 9}$$

$$R_{CH,sp} = \frac{\rho_D W_{cell} d_t}{\frac{S_j}{2}} \quad \text{Equation 10}$$

Referring to FIG. 5, $R_{CH}$ refers to resistance appearing in a trench Schottky junction region, and resistivity of $R_{CH}$ is equal to that of $R_{JFET}$, but according to a Schottky junction characteristic, a resistance value of $R_{CH}$ is smaller than that of $R_{JFET}$ because there is no decrement in area due to a depletion region.

Therefore, a total resistance value $R_{total,sp}$ of the resistance components considering the area in the WTJBS according to one embodiment of the present invention is smaller than the total resistance value of the conventional TJBS of FIG. 2.

Further, in the SiC WTJBS according to one embodiment of the present invention, a voltage drop $V_{F,WTJBS}$ in an ON state is expressed by the following Equation 11.

$$V_{F,WTJBS} = (\Phi_{BN} - \Delta\Phi_{BN}) + \frac{kT}{q}\ln\left(\frac{\left(\frac{S_j + 2d_t}{W_{cell2}}\right)J_F}{A^{**}T^2}\right) + J_F R_{total,sp} \quad \text{Equation 11}$$

Here, $V_F$ means a forward voltage drop, $\Phi_{BN}$ means a height of a Schottky junction barrier, $\Delta\Phi_{BN}$ means a height of a Schottky junction barrier reduced by an image charge barrier descent phenomenon, $A^{**}$ means an effective Richardson constant, k means a Boltzmann constant, $S_j$ means a width between P$^+$ junction patterns, $W_{cell2}$ means an overall width of a single cell of the $W_{TJBS}$, $J_F$ means a forward current density, and $R_{total,sp}$ means the sum of resistance components in consideration of an area.

Referring to Equation 11, in the SiC WTJBS according to one embodiment of the present invention, a term of the current density may be increased by a current increment at the voltage drop in the ON state, but since the total resistance value Rtotal,sp is reduced, an overall voltage drop in the ON state becomes smaller than that of the conventional TJBS of FIG. 2.

As with the ON state characteristic, an amount of the leakage current in the OFF state of the SiC WTJBS according to one embodiment of the present invention is such that an area of a current source increases due to the exposure of the sidewall of the trench, and at this point, the amount of the leakage current $J_{L,WTJBS}$ is expressed by Equation 12.

$$J_{L,WTJBS} = -\frac{S_j + 2d_t}{W_{cell2}}A^{**}T^2\exp\left(\frac{q(\Phi_{BN} - \Delta\Phi_{BN})}{kT}\right) \quad \text{Equation 12}$$

Referring to Equation 12, the amount of the leakage current in the OFF state of the SiC WTJBS according to one embodiment of the present invention is shown to increase by $2d_t$ compared with the conventional TJBS 20 of FIG. 2.

Assuming the WTJBS 30 has $(d_t+d_j)$ equal to $S_j$ of the TJBS 20, according to a characteristic of a surface electric field applied to the Schottky junction, which is reduced in proportion to a distance, the TJBS and the WTJBS have the same depth of the P$^+$ junction pattern with respect to the same depth of the trench so that the TJBS and the WTJBS have the same distance from a potential center to a surface of the Schottky junction such that the TJBS and the WTJBS have the same surface electric field.

That is, when compared with the conventional TJBS, the SiC WTJBS according to one embodiment of the present invention has an effect the same as that of the conventional TJBS with respect to the image charge barrier reduction phenomenon, and only the Schottky junction ratio is increased. Although junction depths are the same, the leakage current of the WTJBS is slightly greater than that of the conventional TJBS, but an increment of the leakage current is extremely small as compared with the WTJBS which has the higher current density characteristic.

Further, the SiC WTJBS according to one embodiment of the present invention may decrease the surface electric field by sacrificing a portion of the current density and further increasing the depth of the junction pattern such that there is an effect of effectively improving the trade-off relationship of the leakage current and the current density.

Meanwhile, since the Schottky junction is three-dimensionally configured, the SiC WTJBS 30 should be designed in consideration of a relationship between a trench structure and a surface electric field.

Figure 6:
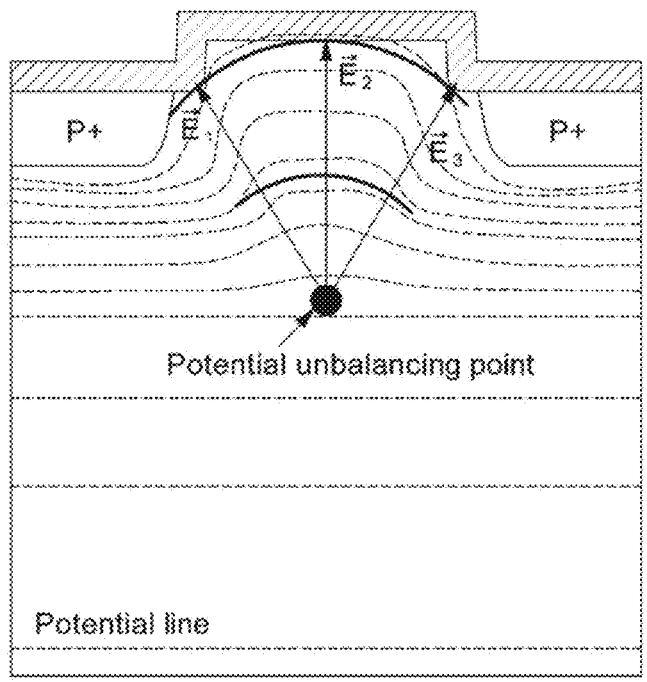
FIG. 6 is a diagram illustrating a potential distribution in an OFF state of the SiC WTJBS according to one embodiment of the present invention.

FIG. 6 is a diagram illustrating a potential distribution in an OFF state of the SiC WTJBS according to one embodiment of the present invention.

Referring to FIG. 6, a potential unbalancing occurs while a potential in an OFF state, which is uniformly increased from a cathode node by a uniform electric field distribution, approaches the vicinity of the P$^+$ junction pattern. An unbalancing point between the P$^+$ junction patterns is determined as a point where reverse voltages, which are applied to the depletion region generated in the OFF state between the P$^+$ junction pattern and the N$^-$ epitaxial layer, intersect with each other when increased.

The electric field decreases from the unbalancing point to the Schottky junction, and the electric field reaching the Schottky junction area becomes a Schottky surface electric field. That is, since the Schottky surface electric field is determined according to a distance, in order for the Schottky junctions of the sidewall and the upper part to have the same leakage current, electric fields E1, E2, and E3 to positions of Schottky junctions in FIG. 6 should have the same value, and to this end, a distance from the unbalancing point to each of the Schottky junctions should be the same.

Figure 7:
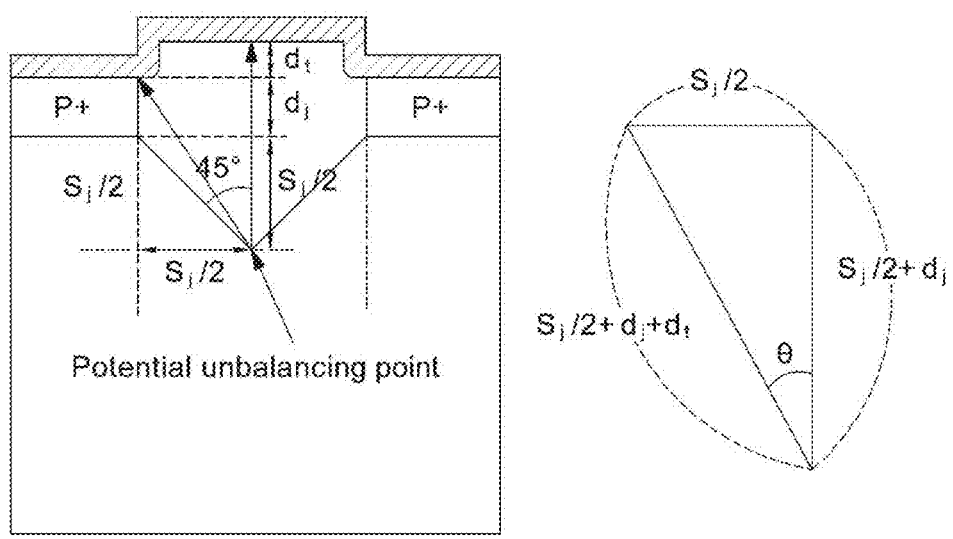
FIG. 7 is a diagram illustrating design parameters for having a minimum leakage current from a potential unbalancing point of a Schottky junction and an upper trench junction in an OFF state of the SiC WTJBS according to one embodiment of the present invention.

FIG. 7 is a diagram illustrating design parameters for having a minimum leakage current from a potential unbalancing point of a Schottky junction and an upper trench junction in an OFF state of the SiC WTJBS according to one embodiment of the present invention.

Referring to FIG. 7, when the P$^+$ junction pattern in the OFF state and the depletion region in the N$^-$ epitaxial layer expand and increase at the same ratio in both x and y directions, the potential unbalancing point may be the same as a point where oblique lines of 45° direction extending from both P$^+$ junction patterns meet.

According to one embodiment of the present invention, in the above case, it is analyzed that a point where a distance to the Schottky junction and a distance between the trench and the P$^+$ junction are the same becomes an optimal point at which the leakage current is minimized.

As shown in FIG. 7, the optimal point of the minimum leakage current has a triangular relationship and this may be expressed by Equation 13.

That is, according to one embodiment of the present invention, when the vertical depth $d_t$ of the trench of the WTJBS and the vertical depth $d_j$ of the P$^+$ junction pattern satisfy Equation 13, a structure is obtained for the minimum leakage current.

$$\left(\frac{S_j}{2} + d_j + d_t\right)^2 = \left(\frac{S_j}{2} + d_j\right)^2 + \left(\frac{S_j}{2}\right)^2 \quad \text{Equation 13}$$

Here, $S_j$ means a width between the P$^+$ junction patterns, $d_j$ means a vertical depth of the P$^+$ junction pattern, and de means a vertical depth of the trench.

When a structure of the SiC WTJBS is designed, Equation 13 may be a measure for finding an optimal point of the current density characteristic and the leakage current using the relationship of a depth of a trench and a distance between a P$^+$ junction and an adjacent P$^+$ junction according to an available junction depth in the SiC manufacturing process.

FIGS. 8, 9, 10, 11 and 12 are diagrams illustrating an example of a manufacturing method of a SiC WTJBS according to one embodiment of the present invention.

According to embodiments which will be described, the various operations relating to a manufacturing of a SiC WTJBS are well known, and thus for simplicity of explanation, conventional known operations may only be briefly described herein or omitted without describing the details of well-known processes, and only characteristic operations according to one embodiment of the present invention will be described.

Further, in a manufacturing method of a SiC WTJBS according to one embodiment of the present invention, each parameter may have a tolerance of about 5%.

Figure 8:
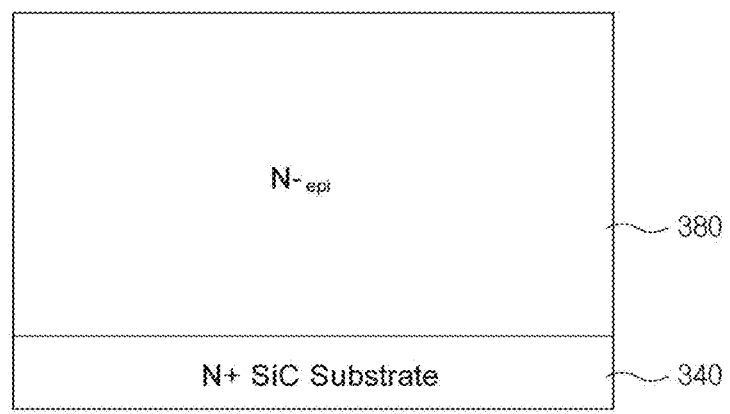
FIGS. 8, 9, 10, 11 and 12 are diagrams illustrating an example of a manufacturing method of a SiC WTJBS according to one embodiment of the present invention.

FIG. 8 illustrates formation of an N$^+$ epitaxial layer in the manufacturing method of a SiC WTJBS.

Referring to FIG. 8, in the manufacturing method of a SiC WTJBS, an N$^-$ epitaxial layer 380 doped with an N$^-$ type impurity is formed on a prepared N$^+$ SiC substrate 340.

According to one embodiment of the present invention, a doping concentration of the N$^-$ epitaxial layer 380 is 1.0 ($\pm 5\%$)$\times 10^{15}$ cm$^{-3}$, and a vertical height of the N$^-$ epitaxial layer 380 is formed to be 15 ($\pm 5\%$) μm.

Figure 9:
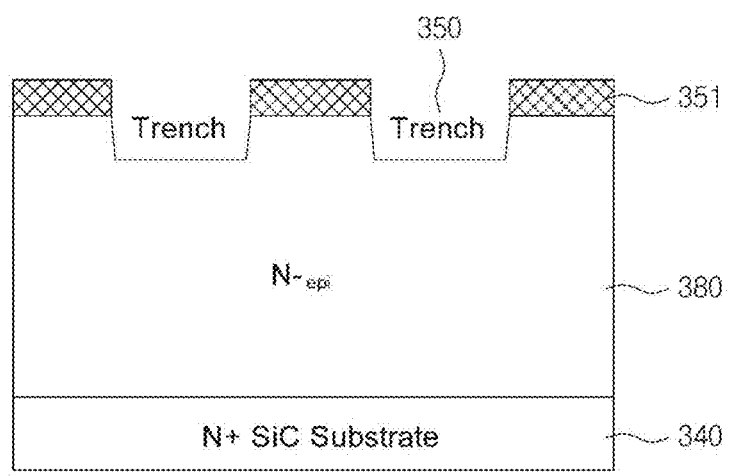

FIG. 9 illustrates formation of a trench in the manufacturing method of a SiC WTJBS.

Referring to FIG. 9, a hard mask pattern 351 for trench etching is formed on an upper end part of the N$^-$ epitaxial layer 380, which is formed in the forming of the N$^-$ epitaxial layer, and then a trench 350 is formed at predetermined intervals by performing etching through a dry or wet etching method.

According to one embodiment of the present invention, the trench 350 having a vertical depth in the range of 0.3 (+5%) to 0.5 ($\pm 5\%$) μm is formed in the formation of the trench.

According to one embodiment of the present invention, in the manufacturing method of a SiC WTJBS, a vertical depth $d_t$ of the trench 350 is in the range of 0.3 (+5%) to 0.5 ($\pm 5\%$) ($\pm 5\%$) μm, a width $W_t$ of the trench 350 is in the range of 3 ($\pm 5\%$) to 5 ($\pm 5\%$) μm, and an interval between the trenches 350 is in the range of 1 ($\pm 5\%$) to 4 ($\pm 5\%$) μm.

In the case of the manufacturing method of a WTJBS according to one embodiment of the present invention, a reascending phenomenon of the leakage current may occur at a depth of the trench exceeding a depth of the P$^+$ junction pattern.

In an exemplary embodiment of the present invention, when the depth of the trench is in the range of 0.4 to 0.5 μm, an excellent leakage current characteristic may be achieved, and a distance between the P$^+$ junction patterns may be optimally shortened.

Further, when the depth of the trench is 0.5 μm or less, occurrence of a micro-trench phenomenon, in which the vicinity of a trench corner is etched deeper than an inner flat surface, decreases during SiC etching. To consider the above-described process limitations and design optimizations, a preferred vertical depth of the trench allowing a low leakage current without the micro-trench phenomenon was analyzed to be 0.4 ($\pm 5\%$) μm.

Figure 10:
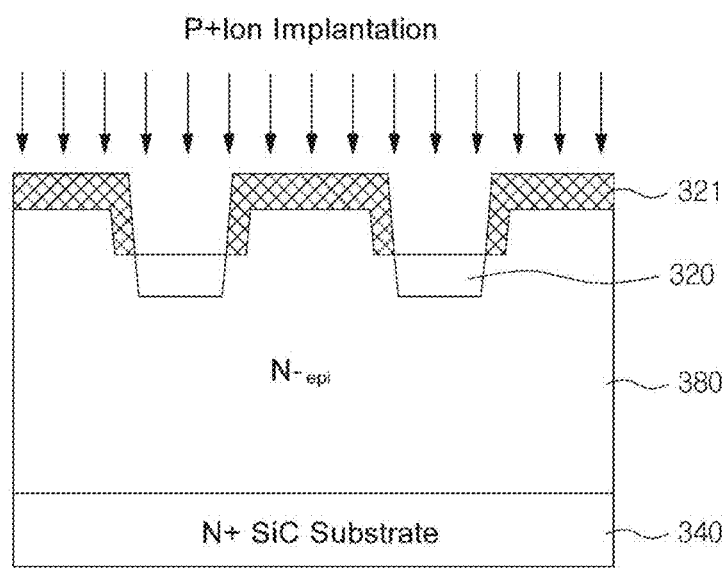

FIG. 10 illustrates formation of a P$^+$ junction pattern in the manufacturing method of a SiC WTJBS.

Referring to FIG. 10, after the formation of the trench, the hard mask 351 is removed, an oxide film mask pattern 321 for a space for P$^+$ ion implantation is formed on an upper end part of the N$^-$ epitaxial layer 380, and a P$^+$ junction pattern 320 is formed at a lower part of the trench by injecting P$^+$ ions from the top.

According to one embodiment of the present invention, the oxide film mask pattern 321 for etching the P$^+$ junction pattern 320 is formed to cover a sidewall of the trench 350 so as to prevent the sidewall of the trench 350 from being exposed. Thus, the space for P$^+$ ion implantation formed by the oxide film mask pattern 321 for etching is formed to be narrower than an inner width of the trench.

According to one embodiment of the present invention, a width $W_j$ of the P$^+$ junction pattern 320 is formed in the range of 2 (+5%) to 4 ($\pm 5\%$) μm, and a vertical depth $d_j$ of the P$^+$ junction pattern 320 is formed as 0.5 (+5%) μm, and a space $S_j$ between the P$^+$ junction patterns 320 is formed in the range of 2 ($\pm 5\%$) to 4 ($\pm 5\%$) μm.

Figure 13:
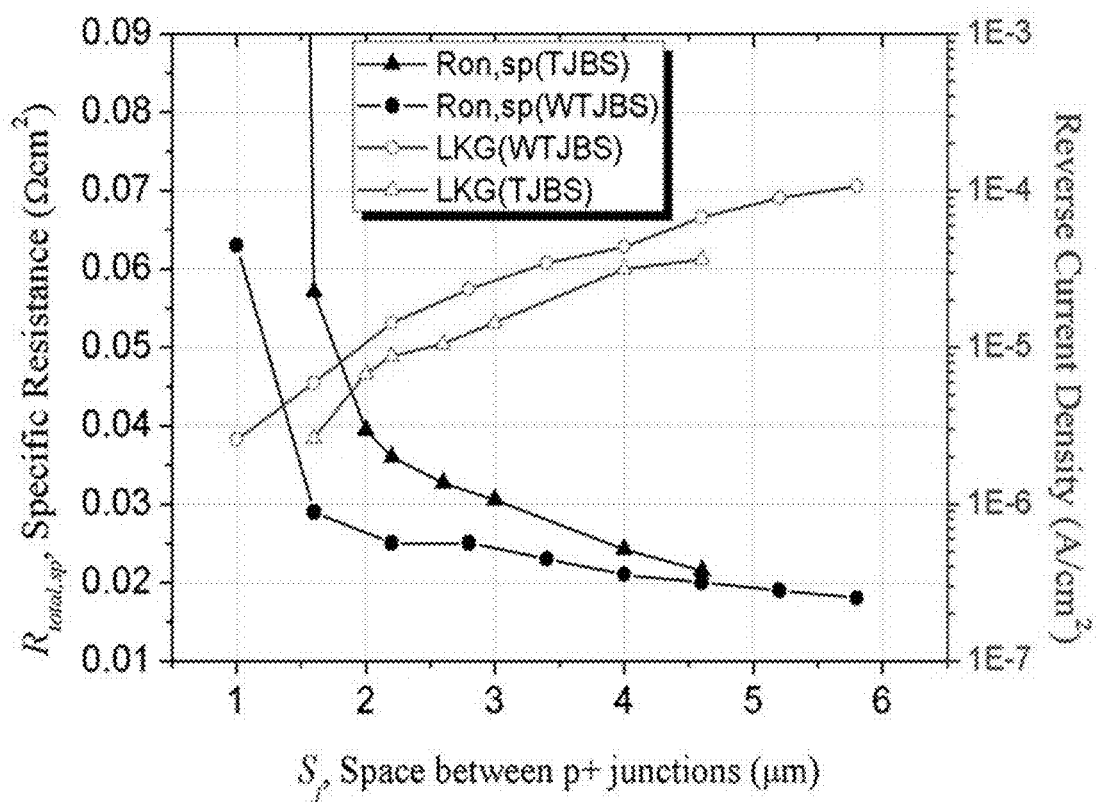
FIG. 13 is a graph showing electrical characteristics of ON and OFF states of the TJBS and the WTJBS according to intervals of a P+ junction pattern.

FIG. 13 is a graph showing electrical characteristics of ON and OFF states of the TJBS and the WTJBS according to a space $S_j$ between the P$^+$ junction patterns 320.

Referring to FIG. 13, as the space $S_j$ between the P$^+$ junction patterns 320 increases, both the TJBS and the WTJBS have characteristics in which ON state resistance decreases and a leakage current density increases.

Thus, it can be seen that the WTJBS may obtain an optimal leakage current density of the TJBS with a space of 2.2 μm between the P$^+$ junction patterns 320, and at this point, ON state resistance is reduced by about 20% more than ON state resistance at $S_j$=3 μm of the TJBS.

From the foregoing description, it can be seen that the WTJBS may achieve a current density characteristic higher than the structure of the TJBS of FIG. 3 at the same leakage current level through design optimization.

In one embodiment of the present invention, the space $S_j$ between the P$^+$ junction patterns 320 in consideration of the ON state current density characteristic and optimization of resistance to leakage current density is set to 2.2 ($\pm 5\%$) μm.

Figure 11:
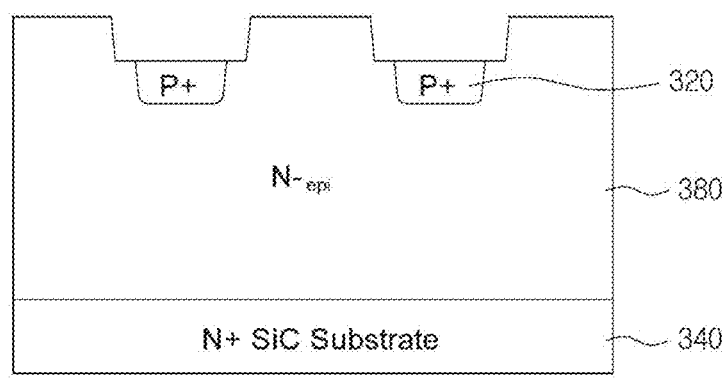

FIG. 11 illustrates first annealing in the manufacturing method of a SiC WTJBS.

Referring to FIG. 11, after the formation of the P$^+$ junction pattern, the oxide film mask 321 is removed, and then first annealing is performed.

Annealing according to one embodiment of the present invention is performed at a temperature of 1,700° C.

Figure 12:
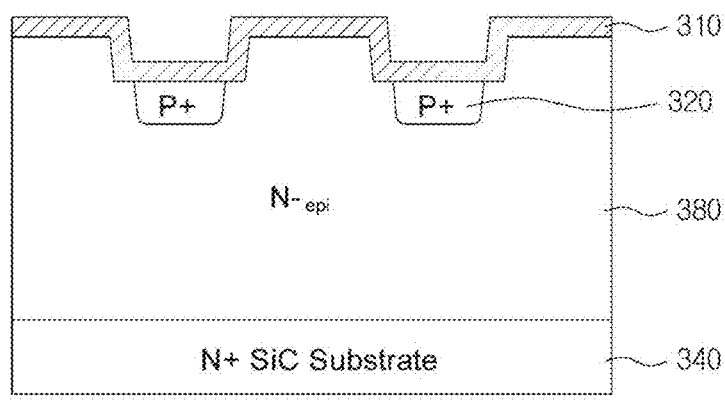

FIG. 12 illustrates formation of a Schottky metal in the manufacturing method of a SiC WTJBS.

Referring to FIG. 12, after first annealing, forming of a Schottky metal layer is performed.

The Schottky metal of the SiC WTJBS according to one embodiment of the present invention is formed by applying Ti with a thickness of 3000 (±5%) Å.

After the forming of the Schottky metal, forming of upper and lower electrodes (not shown) is performed, and then second annealing for metal bonding is further performed.

Second annealing according to one embodiment of the present invention is performed at a temperature of 450° C.

Next, in order to determine the characteristic of the SiC WTJBS according to one embodiment of the present invention, characteristics of a JBS and a TJBS, which are manufactured with the same cell width, the same N⁻ epitaxial layer concentration, and the same thickness, are compared with each other.

Figure 14A:
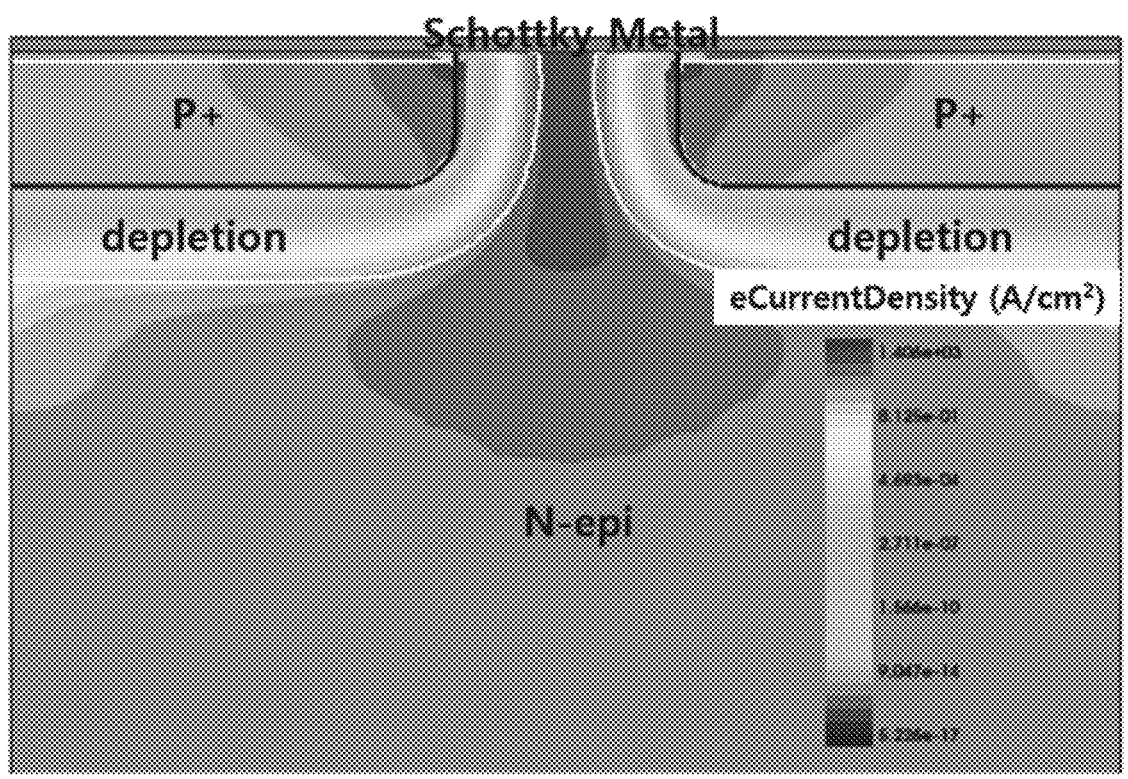
FIGS. 14A, 15A, and 16A are diagrams illustrating current flow patterns in ON states
Figure 14B:
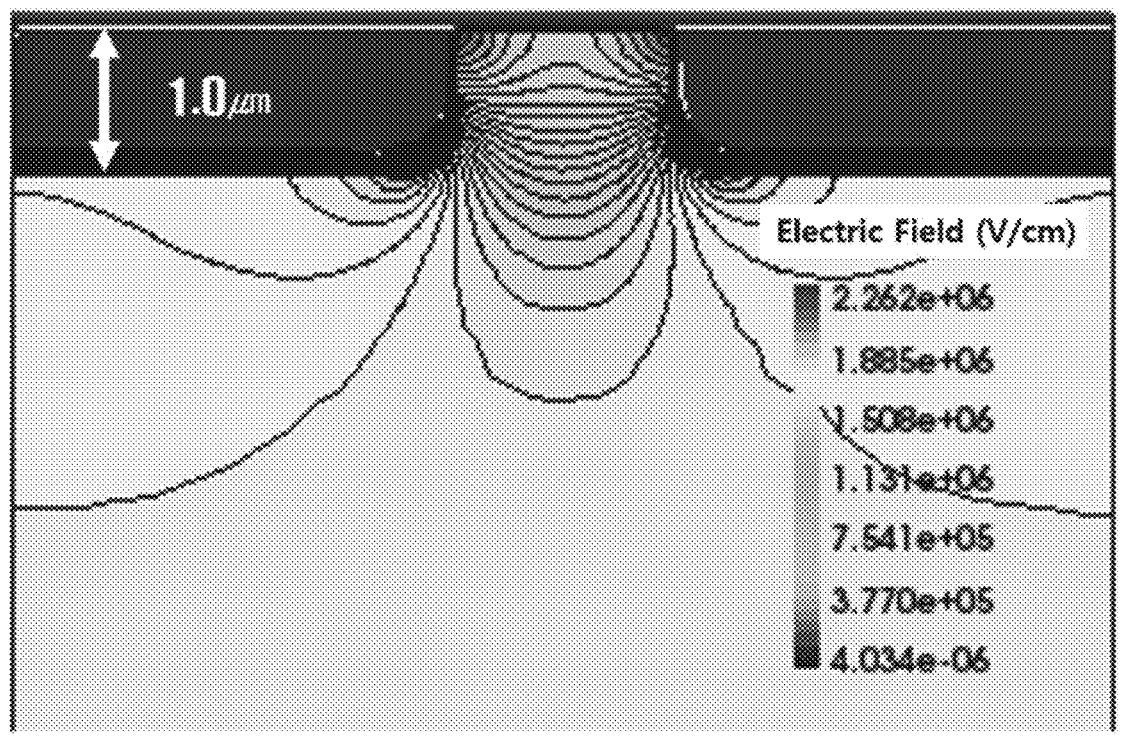
FIGS. 14B, 15B, and 16B are diagrams illustrating electric field intensity patterns in OFF states of the JBS, the TJBS, and the WTJBS.
Figure 15A:
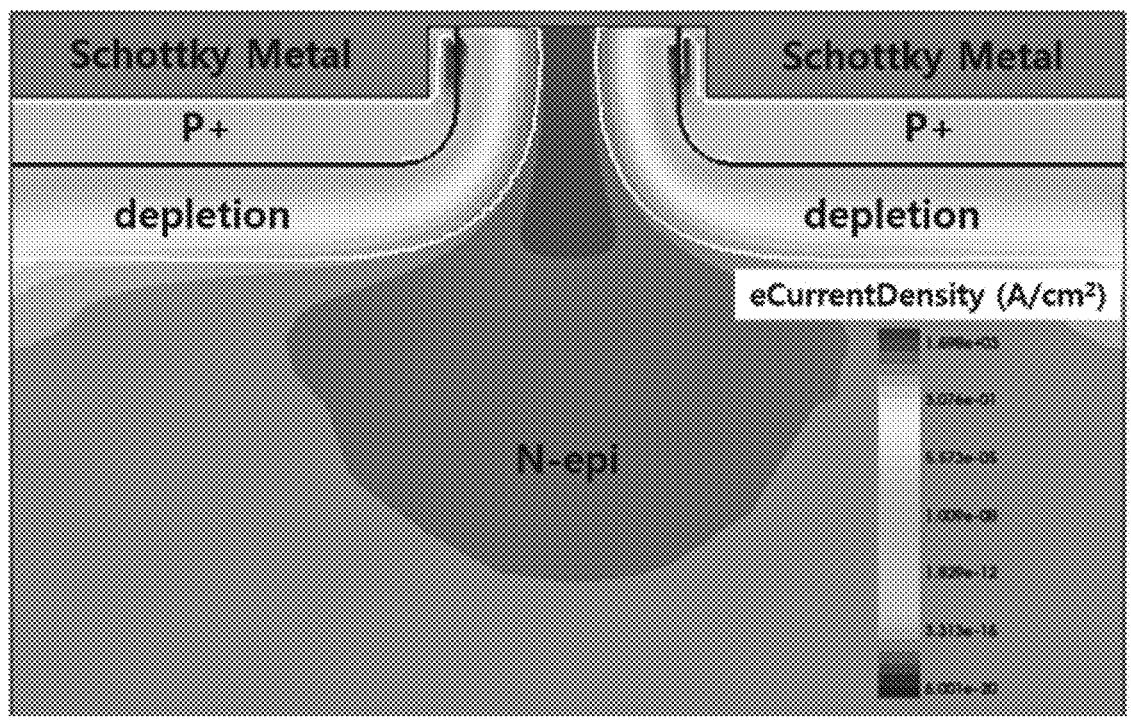
Figure 15B:
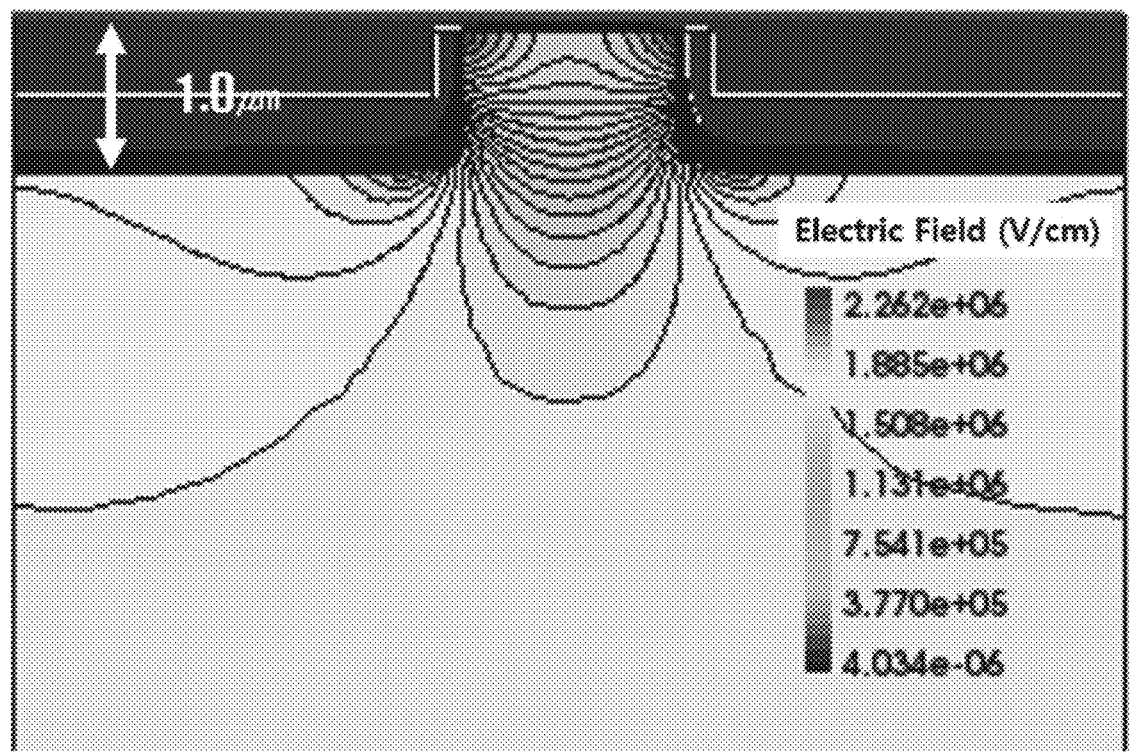
Figure 16A:
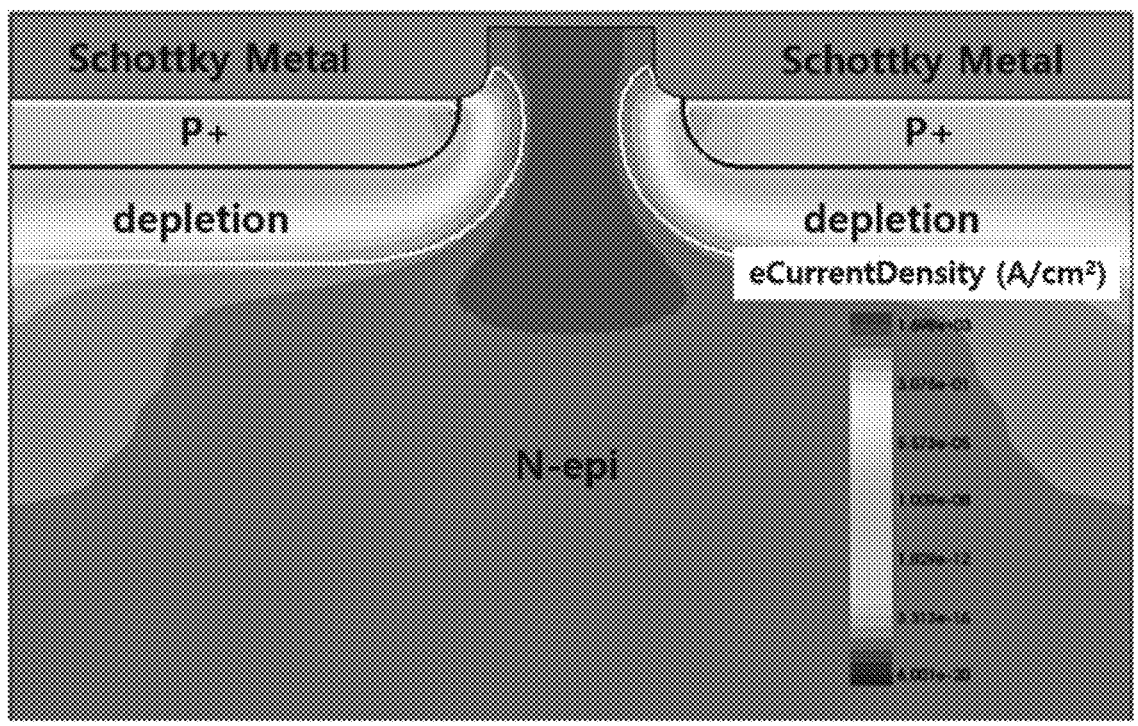
Figure 16B:
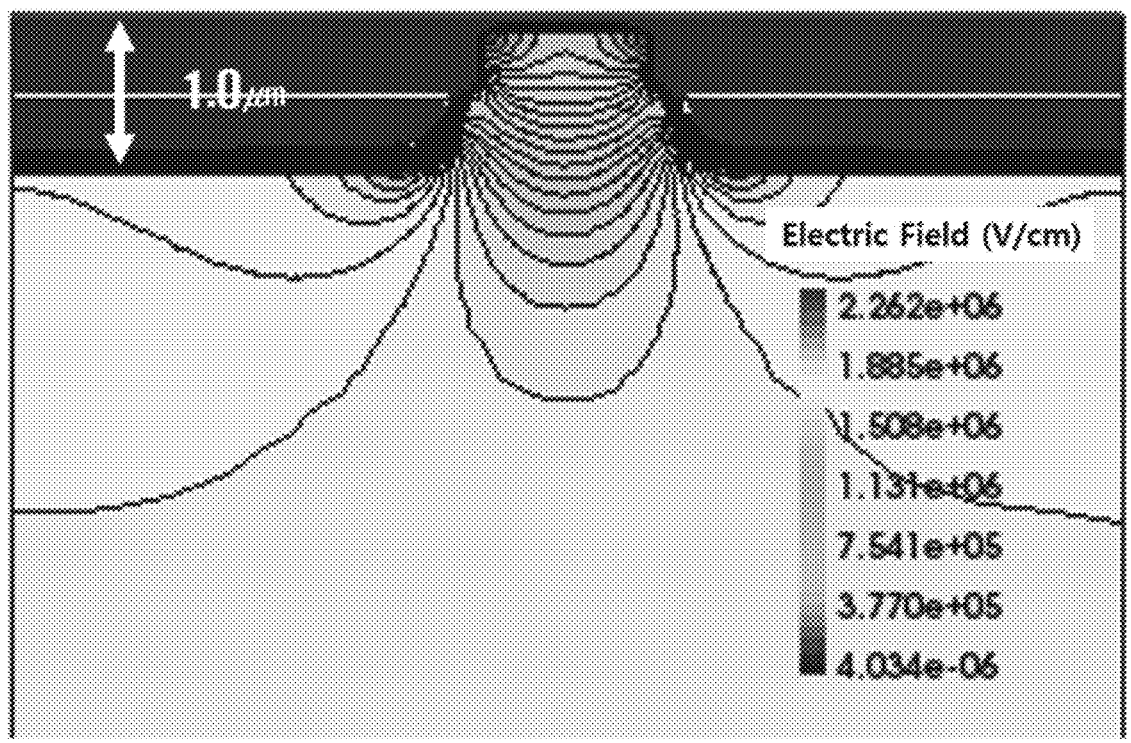

FIGS. 14A, 15A, and 16A are diagrams illustrating current flow patterns in ON states and FIGS. 14B, 15B, and 16B are diagrams illustrating electric field intensity patterns in OFF states of the JBS, the TJBS, and the WTJBS.

Referring to the current flow patterns in ON states of FIGS. 14A, 15A and 16A, unlike the JBS and TJBS of FIGS. 14A and 15A, it can be seen that a current flow occurs in a portion where the Schottky junction is exposed in the WTJBS of FIG. 16, and the JFET region due to the depletion region is not generated in the trench and is generated only in a depth portion of the P⁺ junction pattern.

From the foregoing description, it can be seen that more current flow is dispersed in the WTJBS than the JBS and the TJBS (as a current amount increases, a deep red color is exhibited).

Figure 17:
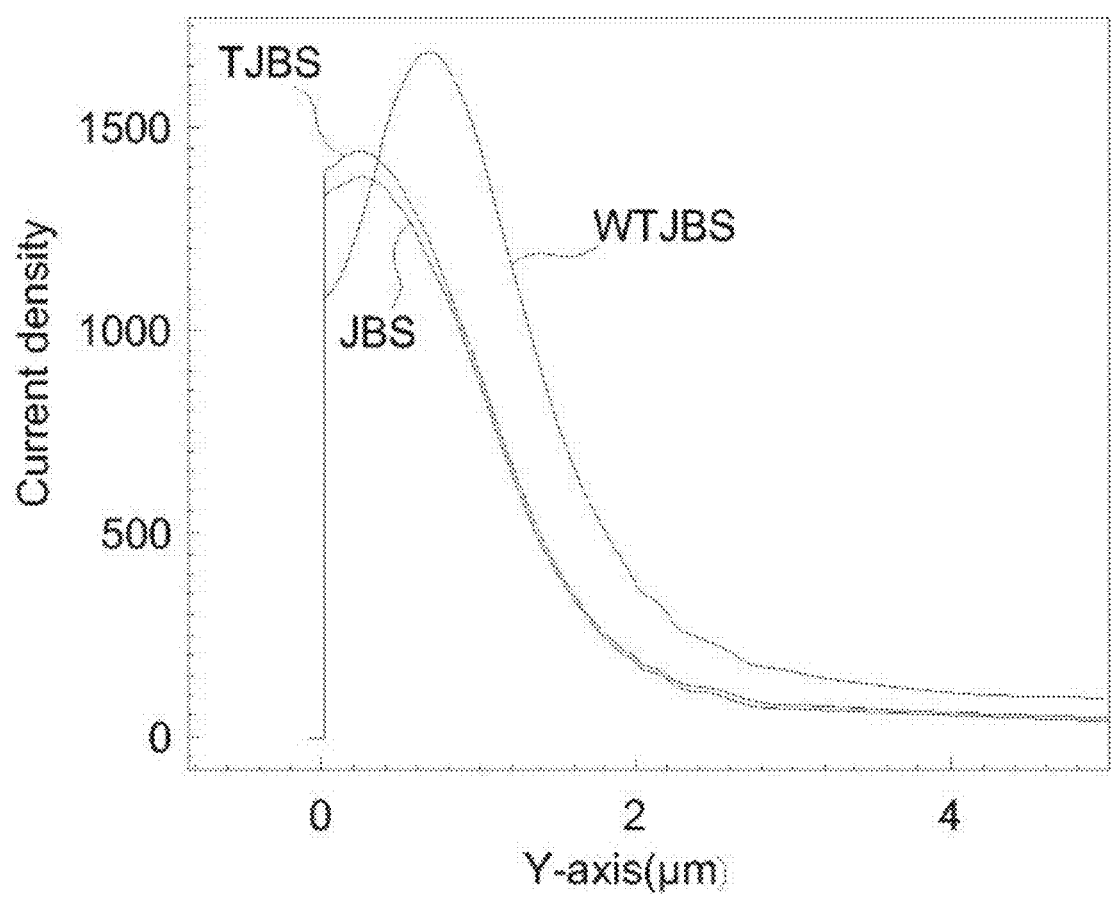
FIG. 17 is a graph showing variations of current densities in ON states of the JBS, the TJBS, and the WTJBS.

FIG. 17 is a graph showing variations of current densities in ON states of the JBS, the TJBS, and the WTJBS.

Referring to FIG. 17, it can be seen that the current density of the WTJBS according to one embodiment of the present invention is greater than those of the conventional JBS and TJBS.

The reason for this is analyzed to be that the WTJBS secures a broader Schottky range than the existing JBS and TJBS and secures a path through which a current may flow such that the current density becomes high.

Further, it is analyzed that the JBS and the TJBS have a lower current density due to the higher resistance value of $R_{JFET}$ compared with that of the WTJBS, while the WTJBS has a higher current density due to a lower resistance value and a wider Schottky junction area.

In FIGS. 14 to 16, the electric field intensity pattern (b) in the OFF state is a structure showing electric fields applied to a device when a reverse voltage is applied, and it can be seen that a maximum electric field is applied to an edge portion among red circle portions in each structure.

Generally, as a maximum electric field applied to a diode element decreases, the diode element has better performance.

Referring to the electric field intensity pattern (b) in the OFF state of FIGS. 14 to 16, it can be seen that the P⁺ junction pattern has an effect of decreasing the electric field to the Schottky junction while concentrating the electric field.

Figure 18:
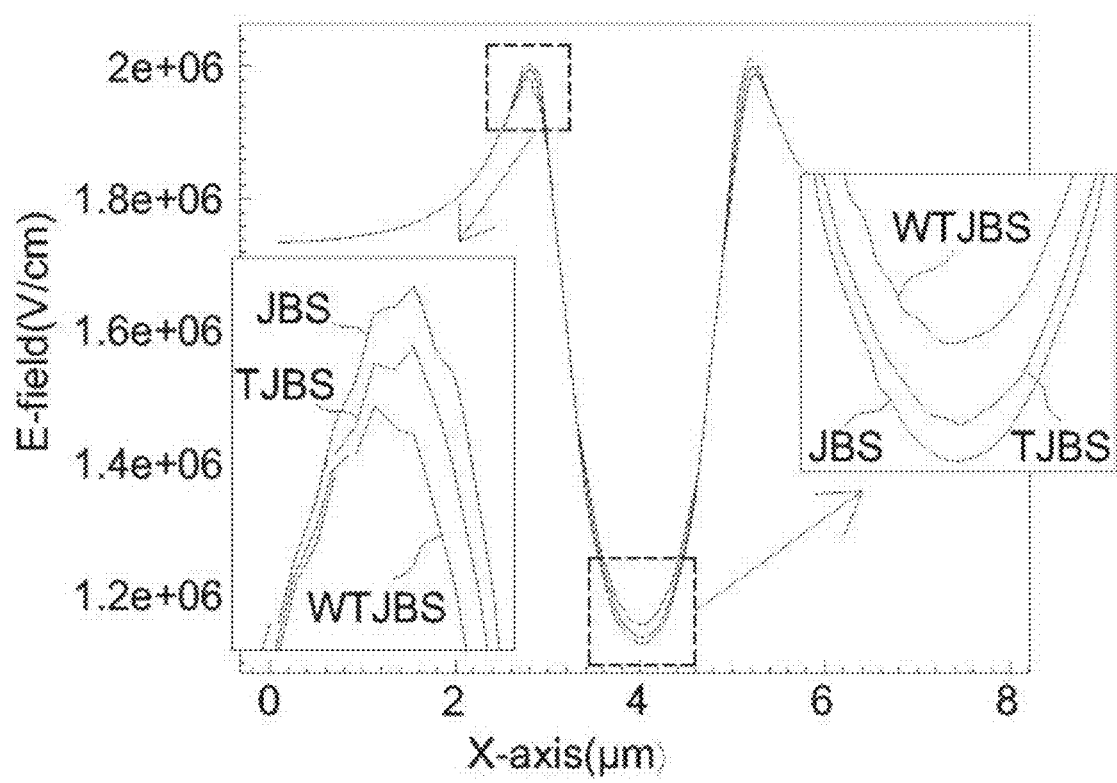
FIG. 18 is a graph showing variations of electric field intensities in OFF states of the JBS, the TJBS, and the WTJBS.

FIG. 18 is a graph showing variations of electric field intensities in ON states of the JBS, the TJBS, and the WTJBS.

Referring to FIGS. 17 and 18, it can be seen that a highest electric field is applied to the JBS, and a lowest electric field is applied to the WTJBS.

In the case of the WTJBS, it is analyzed that the Schottky junction has a lowest electric field concentration because a weaker electric field concentration occurs due to an electric field dispersion effect by an area that is wider than that of the JBS or the TJBS.

Figure 19:
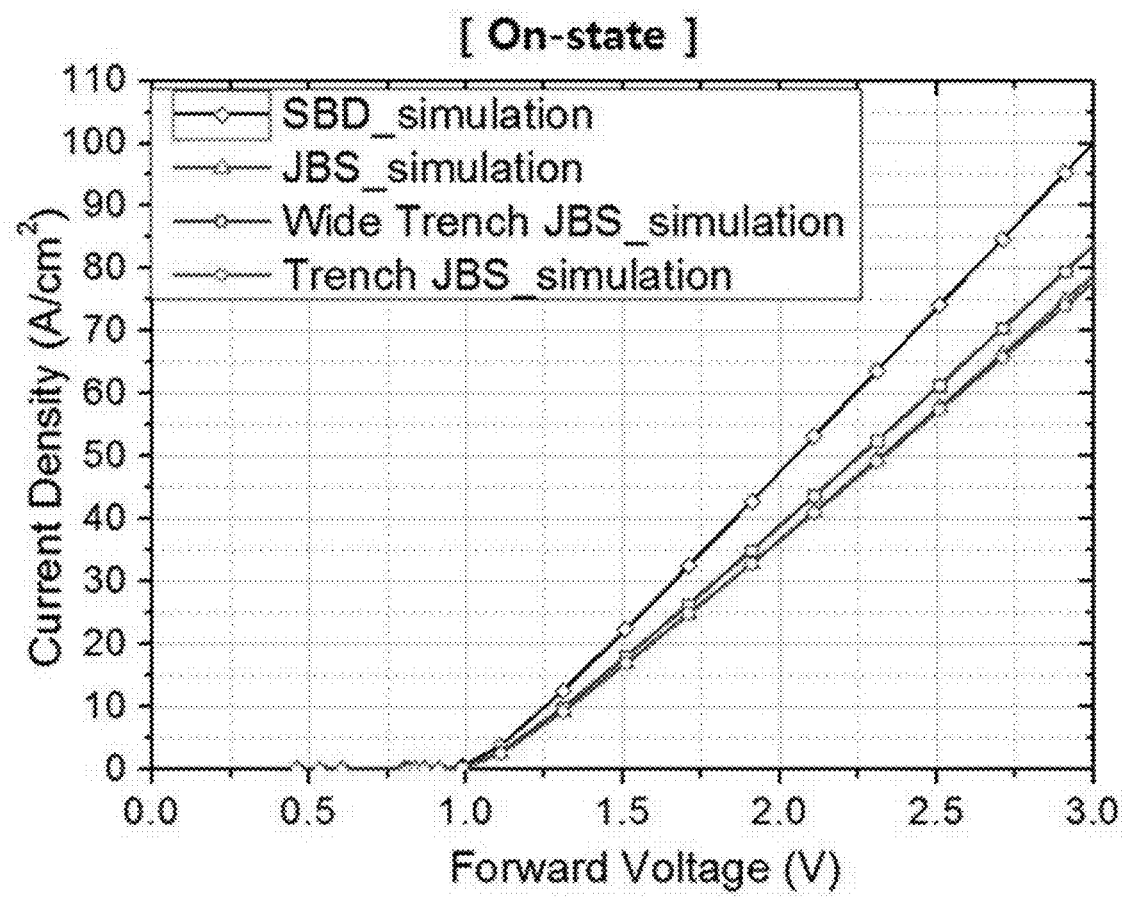
FIG. 19 is a graph showing electrical characteristics in ON states of a Schottky barrier diode (SBD), the JBS, the TJBS, and the WTJBS.

FIG. 19 is a graph showing electrical characteristics in ON states of the SBD, the JBS, the TJBS, and the WTJBS.

FIG. 20 is a graph showing electrical characteristics in OFF states of the SBD, the JBS, the TJBS, and the WTJBS.

FIGS. 19 and 20 illustrate the graphs in which characteristics of the SBD, the JBS, the TJBS, and the WTJBS, which are manufactured to be the same cell size, are compared.

Referring to FIG. 19, in the ON state, the SBD having no junction pattern has a highest current density and the WTJBS has a current density that is higher than that of the JBS or TJBS among the JBS, the TJBS, and the WTJBS, each of which has the junction pattern.

Further, referring to FIG. 20, it can be seen that the WTJBS has a low leakage current in the OFF state.

Referring to FIGS. 19 and 20, the SBD exhibits a highest current density characteristic in the ON state and exhibits a highest leakage current even in the OFF state. From the foregoing description, it can be seen that the current density and the leakage current have a trade-off relationship characteristic.

Therefore, the structure of the WTJBS according to one embodiment of the present invention has an effect of being capable of optimally increasing a current density characteristic of an ON state without increasing a leakage current due to a P⁺ junction pattern as compared with the conventional structure of the TJBD of FIG. 2 and the conventional structure of the JBD of FIG. 1.

That is, the structure of the WTJBS according to one embodiment of the present invention has an effect of being capable of implementing a Schottky diode having an improved leakage current characteristic and an improved current density.

Although a first type semiconductor is defined and described as an N-type semiconductor and a second type semiconductor is defined and described as a P-type semiconductor in one embodiment of the present invention, even when the second type semiconductor is applied as the N-type semiconductor and the first type semiconductor is applied as the P-type semiconductor, the same effect may be attained and thus these semiconductors can be mutually interchanged and applied.

That is, interchanging and applying the above-mentioned N-type and P-type semiconductors to each other is a technique falling within an equivalent scope.

The structure of the WTJBS according to one embodiment of the present invention can implement a Schottky diode having an improved leakage current characteristic and an improved current density.

The SiC WTJBS according to one embodiment of the present invention is suitable for a high speed operation and can be applied to a high speed computer logic circuit, a mixer circuit of an ultrahigh frequency (UHF) tuner, a microwave receiving mixer, a high speed logic diode, and the like.

What is claimed is:

1. A SiC wide trench-type junction barrier Schottky diode, comprising:
   a SiC N− epitaxial layer formed on a SiC N⁺ type substrate;
   a Schottky metal layer in which a planar Schottky metal pattern layer and a trench-type Schottky metal pattern layer are alternately formed on an upper end part of the SiC N− epitaxial layer at predetermined intervals, wherein the trench-type Schottky metal pattern layer is formed on a bottom and a sidewall of a trench that is downwardly depressed from the upper end part of the SiC N– epitaxial layer;

a $P^+$ junction pattern formed by permeating into the SiC N– epitaxial layer below the trench-type Schottky metal pattern layer; and a cathode electrode formed on a lower part of the SiC $N^+$ type substrate, wherein a width of the $P^+$ junction pattern is less than that of the trench-type Schottky metal pattern layer, and the $P^+$ junction pattern is not formed in a vertical surface area of a sidewall of the trench-type Schottky metal pattern layer.

2. The SiC wide trench-type junction barrier Schottky diode of claim 1, wherein the width of the $P^+$ junction pattern is in a range of 2 (±5%) to 4 (±5%) μm, and a vertical depth of the $P^+$ junction pattern is 0.5 (±5%) μm.

3. The SiC wide trench-type junction barrier Schottky diode of claim 1, wherein the $P^+$ junction pattern comprises a plurality of $P^+$ junction patterns spaced a predetermined interval from each other, and wherein the predetermined interval is in a range of 2 (±5%) to 4 (±5%) μm.

4. The SiC wide trench-type junction barrier Schottky diode of claim 3, wherein the predetermined interval is 2.2 (±5%) μm.

5. The SiC wide trench-type junction barrier Schottky diode of claim 1, wherein the $P^+$ junction pattern comprises a plurality of $P^+$ junction patterns spaced a predetermined interval from each other, and wherein a vertical depth $d_t$ of the trench and a vertical depth $d_j$ of each of the $P^+$ junction patterns are in a range satisfying the following equation, Equation 1:

$$\left(\frac{S_j}{2} + d_j + d_i\right)^2 = \left(\frac{S_j}{2} + d_j\right)^2 + \left(\frac{S_j}{2}\right)^2,$$

wherein $S_j$ denotes the predetermined interval.

6. The SiC wide trench-type junction barrier Schottky diode of claim 1, wherein a vertical depth of the trench is in a range of 0.3 (±5%) to 0.5 (±5%) μm, and a width of the trench is in a range of 3 (±5%) to 5 (±5%) μm.

7. The SiC wide trench-type junction barrier Schottky diode of claim 1, wherein the Schottky metal layer is formed by applying Ti with a thickness of 3000 (±5%) Å.

8. The SiC wide trench-type junction barrier Schottky diode of claim 1, wherein a doping concentration of the SiC N– epitaxial layer is 1.0 (±5%)×$10^{15}$ cm$^{-3}$, and a vertical height of the SiC N– epitaxial layer is 15 (±5%) μm.

\* \* \* \* \*

UNITED STATES PATENT AND TRADEMARK OFFICE
CERTIFICATE OF CORRECTION

PATENT NO. : 10,720,535 B2
APPLICATION NO. : 16/797601
DATED : July 21, 2020
INVENTOR(S) : Sin Su Kyoung It is certified that error appears in the above-identified patent and that said Letters Patent is hereby corrected as shown below:

On the Title Page

In Column 1, item (72), Inventors, Line 2, delete "Gawngju-si" and insert --Gwangju-si--.

In the Specification

In Column 2, Line 14, delete "N." and insert --N⁻--.

In Column 2, Line 46, delete "d" and insert --d$_j$--.

In Column 4, Line 31, delete "1P" and insert -- P$^+$--.

In Column 6, Line 40, delete "PD" and insert --ρD--.

In Column 6, Line 60, Equation 6, delete "$J_{JBS} = \frac{S_j}{W_{Cell}} J_s \left[ \exp\left(\frac{q(V_\alpha - J_P R_{total,sp})}{nkT}\right) - 1 \right]$" and insert --$J_{TJBS} = \frac{S_j}{W_{Cell}} J_s \left[ \exp\left(\frac{q(V_\alpha - J_P R_{total,sp})}{nkT}\right) - 1 \right]$--.

In Column 7, Line 10, Equation 7, delete "$J_{LJBS} = -\frac{S_j}{W_{cell}} A T^2 \exp\left(-\frac{q(\Phi_{BN} - \Delta\Phi_{BN})}{kT}\right)$" and insert --$J_{L,TJBS} = -\frac{S_j}{W_{cell}} A T^2 \exp\left(-\frac{q(\Phi_{BN} - \Delta\Phi_{BN})}{kT}\right)$--.

In Column 8, Line 41, delete "W$_{TJBS}$," and insert --WTJBS,--.

In Column 9, Line 40, delete "W$_{TJBS}$," and insert --WTJBS,--.

Signed and Sealed this
Twenty-fourth Day of November, 2020

Andrei Iancu
*Director of the United States Patent and Trademark Office*

CERTIFICATE OF CORRECTION (continued)
U.S. Pat. No. 10,720,535 B2

In Column 9, Line 47, delete "Rtotal,sp" and insert --$R_{total,sp}$--.

In Column 11, Line 14, delete "de" and insert --$d_t$--.

In Column 11, Line 36, delete "$N^+$" and insert --$N^-$--.

In Column 11, Line 55, delete "(+5%)" and insert --(±5%)--.

In Column 11, Line 59, delete "(+5%)" and insert --(±5%)--.

In Column 11, Line 59, delete "(±5%" and insert --(±5%)--.

In Column 12, Line 33, delete "(+5%)" and insert --(±5%)--.

In Column 12, Line 34, delete "(+5%)" and insert --(±5%)--.